(12) United States Patent
Adachi et al.

(10) Patent No.: US 10,950,449 B2
(45) Date of Patent: Mar. 16, 2021

(54) SUBSTRATE PROCESSING APPARATUS (71) Applicant: ASM IP Holding B.V., Almere (NL)

(72) Inventors: Wataru Adachi, Kawasaki (JP); Kazuo Sato, Kawasaki (JP)

(73) Assignee: ASM IP Holding B.V., Almere (NL)

( * ) Notice: Subject to any disclaimer, the term of this patent is extended or adjusted under 35 U.S.C. 154(b) by 370 days.

(21) Appl. No.: 15/869,716

(22) Filed: Jan. 12, 2018

(65) Prior Publication Data

US 2019/0221432 A1 Jul. 18, 2019

(51) Int. Cl.
*H01L 21/285* (2006.01)
*C23C 16/44* (2006.01)
*H01J 37/32* (2006.01)
*H01L 21/687* (2006.01)
*H01L 21/67* (2006.01)
*C23C 16/505* (2006.01)
*C23C 16/458* (2006.01)

(52) U.S. Cl.
CPC .... *H01L 21/28556* (2013.01); *C23C 16/4404* (2013.01); *C23C 16/4582* (2013.01); *C23C 16/505* (2013.01); *H01J 37/32449* (2013.01); *H01J 37/32715* (2013.01); *H01L 21/67161* (2013.01); *H01L 21/68764* (2013.01); *H01L 21/68792* (2013.01)

(58) Field of Classification Search
USPC ................................................. 118/715–733
See application file for complete search history.

(56) References Cited

U.S. PATENT DOCUMENTS

| 6,022,586 | A  | * | 2/2000  | Hashimoto | C23C 16/4404 134/1.1 |
| 6,261,408 | B1 | * | 7/2001  | Schneider | C23C 16/4412 118/715 |
| 6,364,949 | B1 | * | 4/2002  | Or | C23C 16/4412 118/69 |
| 6,716,287 | B1 | * | 4/2004  | Santiago | C23C 16/4412 118/728 |
| 2001/0000104 | A1 | * | 4/2001  | Li | H01J 37/32623 216/67 |
| 2004/0206309 | A1 | * | 10/2004 | Bera | H01J 37/321 118/728 |
| 2007/0224817 | A1 | * | 9/2007  | Honda | H01J 37/32623 438/689 |
| 2011/0198417 | A1 | * | 8/2011  | Detmar | H01J 37/321 239/569 |
| 2012/0003836 | A1 | * | 1/2012  | Kellogg | H01L 21/68735 438/710 |
| 2012/0231633 | A1 | * | 9/2012  | Ewert | H01L 21/2855 438/763 |
| 2015/0252479 | A1 |   | 9/2015  | Nakano et al. | |

* cited by examiner

*Primary Examiner* — Rakesh K Dhingra
(74) *Attorney, Agent, or Firm* — Studebaker & Brackett PC (57) ABSTRACT

Examples of a substrate processing apparatus includes a chamber, a susceptor provided in the chamber, a flow control ring of an insulator that is mounted on the chamber and surrounds the susceptor, a shower plate opposed to the susceptor, and a metal film that is formed on a lower surface of the flow control ring while exposing an upper surface of the flow control ring, and is in contact with the chamber.

9 Claims, 10 Drawing Sheets

SUBSTRATE PROCESSING APPARATUS

BACKGROUND

Field

Examples are described which relate to a substrate processing apparatus.

Background

A substrate processing apparatus for processing a substrate with plasma has been known. For example, high frequency power is applied to a shower plate to excite plasma while supplying gas into the gap between a substrate and the shower plate which are arranged away from each other.

SUMMARY

Plasma can be used for film formation on substrates, etching, reforming or the like. Plasma distribution greatly influences processing contents to be executed on substrates. For example, when film formation is performed on a substrate by the PECVD (Plasma-Enhanced Chemical Vapor Deposition) method, the film thickness at the outer peripheral portion of the substrate is greatly dependent on plasma distribution. The plasma distribution is greatly influenced by the raw material and shape of a member in the vicinity of a susceptor. The member in the vicinity of the susceptor may include FCR (Flow Control Ring), a bevel mask or the like. FCR is provided around the susceptor, and defines an exhaust route and suppresses gas from flowing to the lower side of the susceptor. The bevel mask is provided as a mask for covering the outer peripheral portion of the substrate.

When the raw material of the member in the vicinity of the susceptor is changed, the plasma distribution corresponding to the electrical conductivity of the raw material is obtained. When the shape of FCR or bevel mask is changed to obtain an optimum plasma distribution, the conductance of the gas flow path varies. The variation of the conductance of the gas flow path causes variation of a gas flow state and a gas staying state, which may cause deterioration of purging time.

Some examples described herein may address the above-described problem. Some examples described herein may have an object to provide a substrate processing apparatus capable of controlling the plasma distribution with no harmful influence.

In some examples, a substrate processing apparatus includes a chamber, a susceptor provided in the chamber, a flow control ring of an insulator that is mounted on the chamber and surrounds the susceptor, a shower plate opposed to the susceptor, and a metal film that is formed on a lower surface of the flow control ring while exposing an upper surface of the flow control ring, and is in contact with the chamber.

In some examples, a substrate processing apparatus includes a chamber, a susceptor provided in the chamber, a shower plate opposed to the susceptor, a mask of an insulator covering an outer peripheral portion of the susceptor, and a metal film that is formed on a lower surface of the mask while exposing an upper surface of the mask, and is in electrical contact with the chamber.

DETAILED DESCRIPTION

Figure 1:
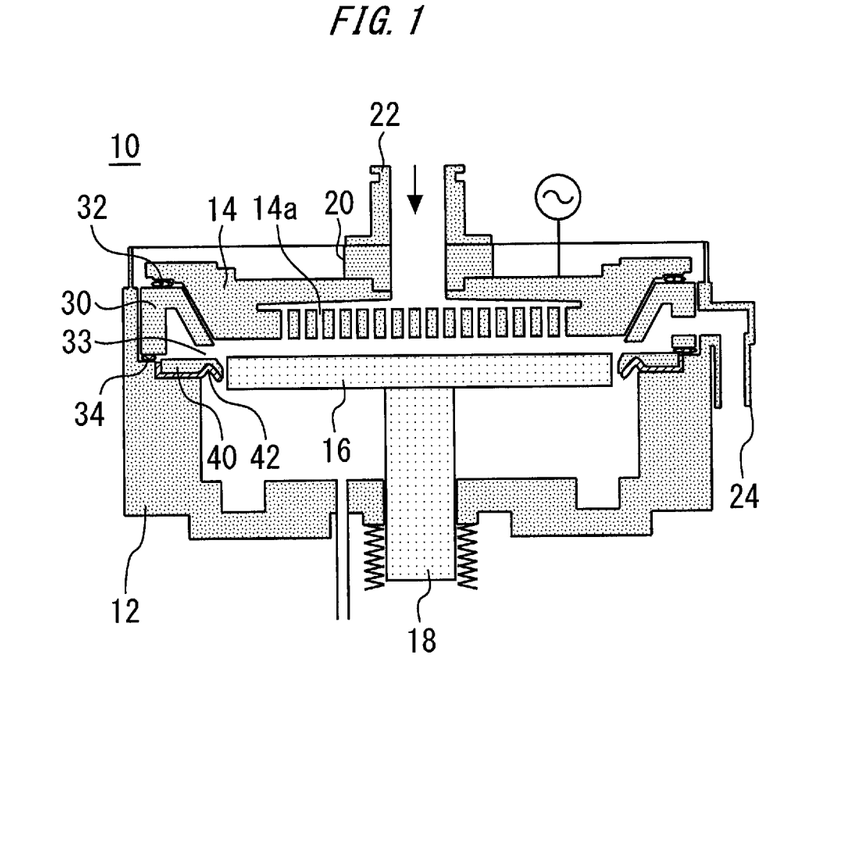
FIG. 1 is a sectional view of the substrate processing apparatus.

FIG. 1 is a cross-sectional view of a film forming apparatus 10. The film forming apparatus 10 may include a reactor chamber 12 formed of a metal. A shower plate 14 is provided in the reactor chamber 12. The shower plate 14 receives electrical power such as RF power. Two RF powers having a different frequency may be applied to the shower plate 14. The shower plate 14 has slits 14a formed therein.

A susceptor 16 is also provided in the reactor chamber 12 and faces the shower plate 14. The susceptor 16 may supported by a sliding shaft 18. The susceptor 16 may be grounded. Thus, the shower plate 14 and the susceptor 16 form a parallel plate structure.

A gas supply inlet 22 may be connected to the shower plate 14 through an insulating part 20. The gas supply inlet 22 may be used to supply material gas to the space between the shower plate 14 and the susceptor 16. The insulating part 20 may be formed of an insulating material and may serves to electrically isolate the shower plate 14 from the gas supply inlet 22.

The reactor chamber 12 may has a gas exhaust outlet 24 on a side thereof. The gas exhaust outlet 24 may be used to discharge the material gas remaining in the reactor chamber 12 after the film forming process. For that purpose a vacuum pump may be connected to the gas exhaust outlet 24.

An exhaust duct 30 is provided between the shower plate 14 and the reactor chamber 12. The exhaust duct 30 is formed of, e.g., ceramic. An O-ring 32 is interposed and suitably compressed between the exhaust duct 30 and the shower plate 14. An O-ring 34 is interposed and suitably compressed between the exhaust duct 30 and the reactor chamber 12.

The exhaust duct 30 may serves two functions. A first function may be to electrically isolate the shower plate 14, to which power is applied, from the reactor chamber 12, which is at GND potential. Therefore, the exhaust duct 30 may be formed of an insulating material. The second function may be to guide the material gas from between the shower plate 14 and the susceptor 16 to the gas exhaust outlet 24. The exhaust duct 30 may has an annular shape so as to laterally surround the susceptor 16 and guide the material gas to the gas exhaust outlet 24.

FCR (flow control ring) 40 is mounted on the chamber 12. FCR 40 may be merely mounted on the upper surface of the chamber 12, or may be positioned by a positioning pin and mounted on the chamber 12. FCR 40 can be formed of an insulator such as ceramic material or the like. FCR 40 is arranged away from the exhaust duct 30. Therefore, a slit 33 is provided between FCR 40 and the exhaust duct 30. The slit 33 leads, into the exhaust duct 30, gas which is supplied through slits 14a of the shower plate 14 onto the susceptor 16. That is, the gas supplied onto the susceptor 16 spreads radially, and flows through the slit 33 in the exhaust duct 30.

The position and shape of FCR 40 define the size of the slit 33 and an exhaust route. FCR 40 may be located so as to be opposed to the side surface of the susceptor 16. In some cases, the upper surface of the susceptor 16 and the upper surface of FCR 40 are made substantially coincident with each other in height, whereby exhaust gas can be rapidly led into the exhaust duct 30.

Furthermore, by providing FCR 40 in the vicinity of the side surface of the susceptor 16, the gas supplied onto the susceptor 16 can be suppressed from flowing to the lower side of the susceptor 16. The distance between FCR 40 and the side surface of the susceptor 16 may be submillimeter or several millimeters, for example. This distance is determined so that the susceptor 16 and FCR 40 are prevented from coming into contact with each other due to vertical movement of the susceptor 16 and thermal expansion of the susceptor 16.

Figure 2:
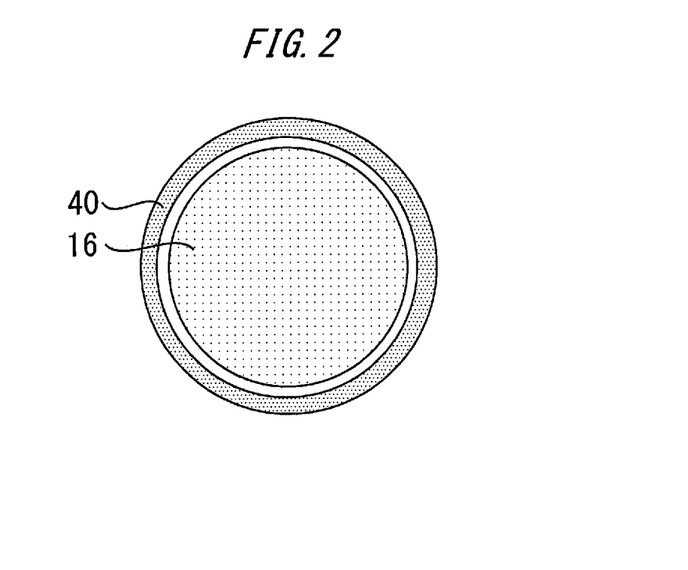
FIG. 2 is a plan view showing FCR and the susceptor.

FIG. 2 is a plan view showing FCR 40 and the susceptor 16. FCR 40 may be configured in such an annular shape as to surround the susceptor 16.

FIG. 1 shows a metal film 42 formed on the lower surface of FCR 40. The metal film 42 is formed on the lower surface of FCR 40 while exposing the upper surface of FCR 40. The material of the metal film 42 is Al (aluminum), but other metal may be used. The thickness of the metal film 42 may be set to 100 µM or more.

Figure 3:
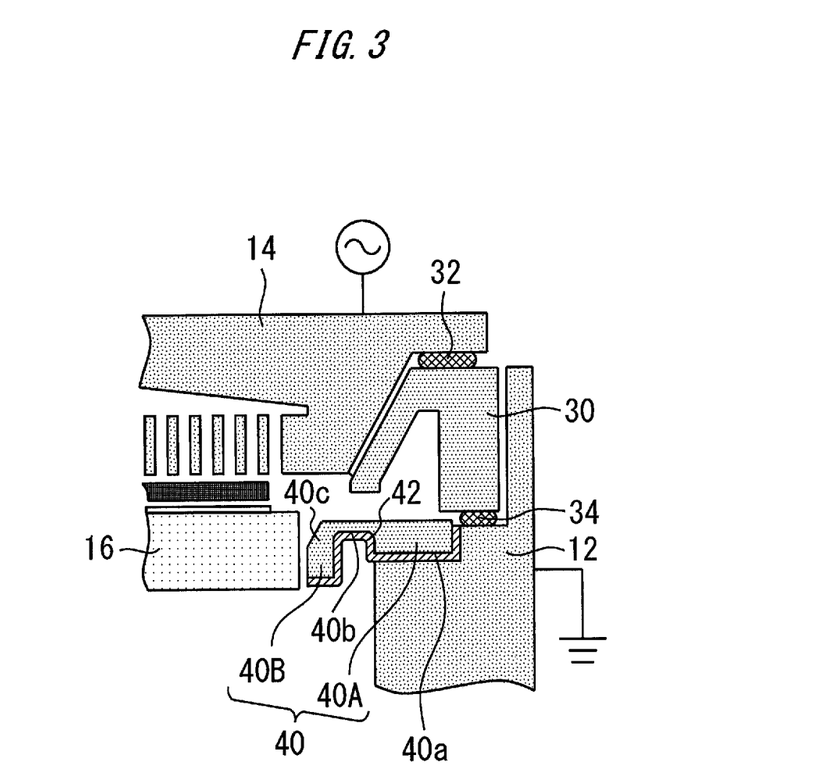
FIG. 3 is a partially enlarged view of FIG. 1.

FIG. 3 is a partially enlarged view of FIG. 1. FCR 40 has a support portion 40A and a protrusion portion 40B. The support portion 40A is a part which is supported by the chamber 12 just above the chamber 12. The protrusion portion 40B is a part which connects to the support portion 40A and protrudes into the chamber 12. The thickness of the support portion 40A is substantially constant. On the other hand, the thickness of the protrusion portion 40B is not constant. The protrusion portion 40B is thinner than the support portion 40A at a contact portion thereof with the support portion 40A, but thicker than the support portion 40A at a portion thereof opposed to the susceptor 16. The lower surface of the support portion 40A is a first lower surface 40a. The lower surface of the protrusion portion 40B has a second lower surface 40b which connects to the first lower surface 40a and is higher than the first lower surface 40a. The protrusion portion 40B has a thick wall part 40c having the largest thickness in FCR 40 at the portion thereof opposed to the susceptor 16.

The metal film 42 of FIG. 3 is formed on the whole lower surface of FCR 40. However, the metal film 42 may be formed only on the first lower surface 40a and the second lower surface 40b. In some examples, formation of the metal film 42 on the first lower surface 40a makes it possible to bring the metal film 42 into contact with the chamber 12, whereby the metal film 42 can be grounded. Furthermore, in some examples, formation of the metal film 42 on the second lower surface 40b makes it possible to provide the metal film 42 of ground potential in the vicinity of a place where plasma occurs.

Figure 4:
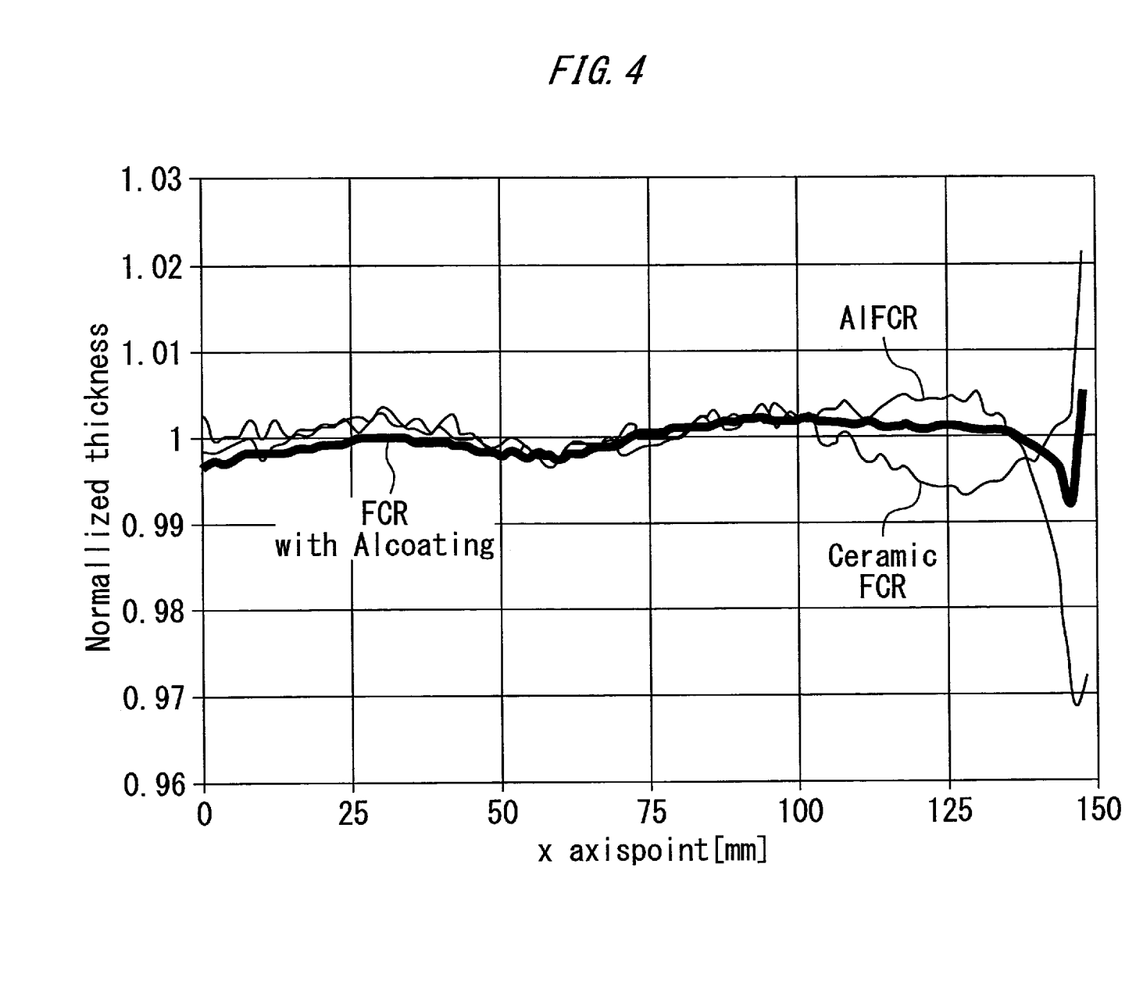
FIG. 4 is a diagram showing an influence of the type of FCR on film formation.

FIG. 4 is a diagram showing an influence of the type of FCR on film formation. FIG. 4 shows film thickness distributions when film formation is performed on wafers of 300 mm under the same condition by using three substrate processing apparatuses differing only in FCR. The abscissa axis represents a position of the substrates. On the abscissa axis, the position of 0 mm corresponds to the center positions of the wafers, and the position of 150 mm corresponds to the outer edge positions of the wafers. The ordinate axis represents a normalized film thickness. A curved line represented by "FCR with Al coating" is obtained by film formation using FCR 40 in which the lower surface shown in FIG. 3 is covered with the metal film 42. A curved line represented by "Al FCR" is obtained by film formation using FCR formed of Al. A curved line represented by "Ceramic FCR" is obtained by film formation using FCR formed of Ceramic.

The curved line represented by "Al FCR" indicates that the film thickness becomes extremely thin on the outer peripheral side of the wafer. The curved line represented by "Ceramic FCR" indicates that the film thickness becomes extremely thick on the outer peripheral side of the wafer. However, the curved line represented by "FCR with Al coating" indicates that the variation of the film thickness on the outer peripheral side of the wafer is relatively small. Accordingly, when a uniform film thickness is required within the plane of the wafer, it is effective to form the metal film 42 on the lower surface of FCR 40.

The metal film 42 formed on the lower surface of FCR 40 serves to adjust the shape of a plasma end portion. Finer adjustment of the shape of the plasma end portion can be implemented by adjusting the distance between the metal film 42 and plasma. In this example, by providing FCR 40 with the second lower surface 40b higher than the first lower surface 40a, the metal film 42 can be made closer to plasma as compared with a case where the second lower surface 40b is flush with the first lower surface 40a. A desired plasma shape can be achieved by approaching the metal film 42 to plasma.

The shape of the upper surface of FCR 40 can be maintained regardless of how the metal film 42 is provided. In this example, the shape of the upper surface of FCR 40 is set to a flat plane located at substantially the same height as the upper surface of the susceptor 16. The conductance of the gas flow path is invariable irrespective of the presence or absence of the metal film 42. Furthermore, since the metal film 42 is located on the lower surface of FCR 40, the metal film 42 is not exposed to plasma, so that the metal film 42 hardly suffers plasma damage and has high durability. In addition, since the metal film 42 is provided to the lower surface of FCR 40, the metal film 42 can be prevented from being lost due to sputtering of the metal film 42 and also being mounted on the wafer.

When RF power to be applied to the shower plate 14 or the type of gas to be supplied in the chamber 12 is changed, the position of the metal film 42 required to achieve a desired plasma shape varies. Therefore, in order to achieve the desired plasma shape, the shape of the lower surface of FCR 40 may be changed, or the position where the metal film 42 is formed may be changed.

Figure 5:
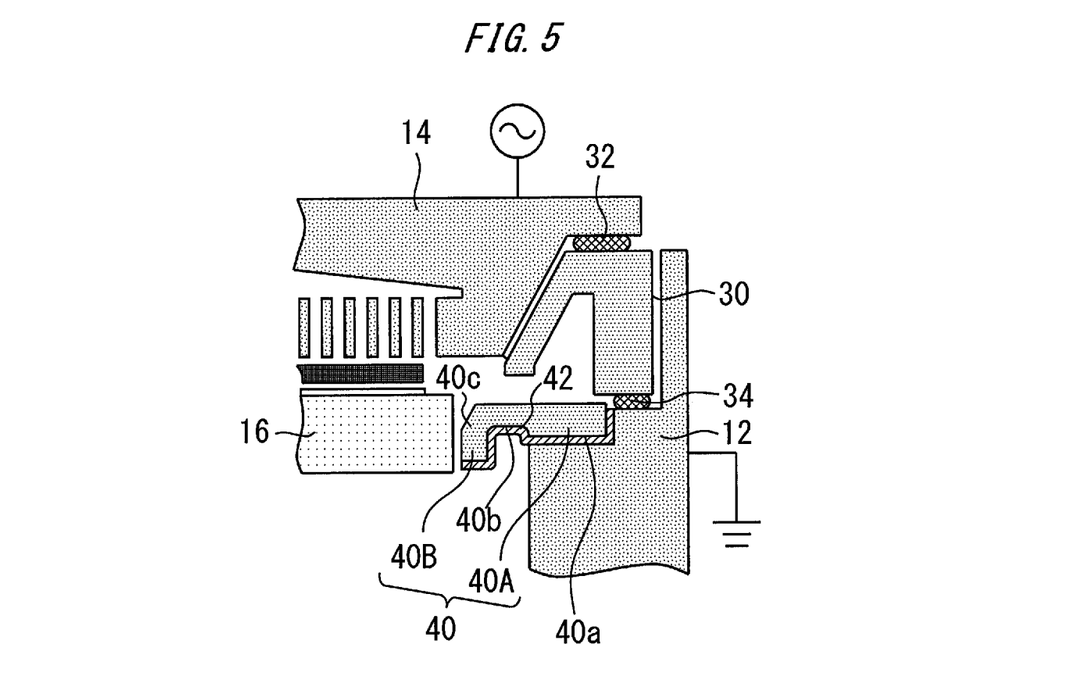
FIG. 5 shows another example of the second lower surface.

FIGS. 5 to 10 show various modifications. FIG. 5 shows that the difference in height between the first lower surface 40a and the second lower surface 40b is set to be smaller than that in the case of FIG. 3. The portion on the chamber 12 side of the protrusion portion 40B is thicker than the corresponding portion of FIG. 3. Therefore, the distance between the metal film 42 and plasma is slightly larger than that in the case of FIG. 3.

Figure 6:
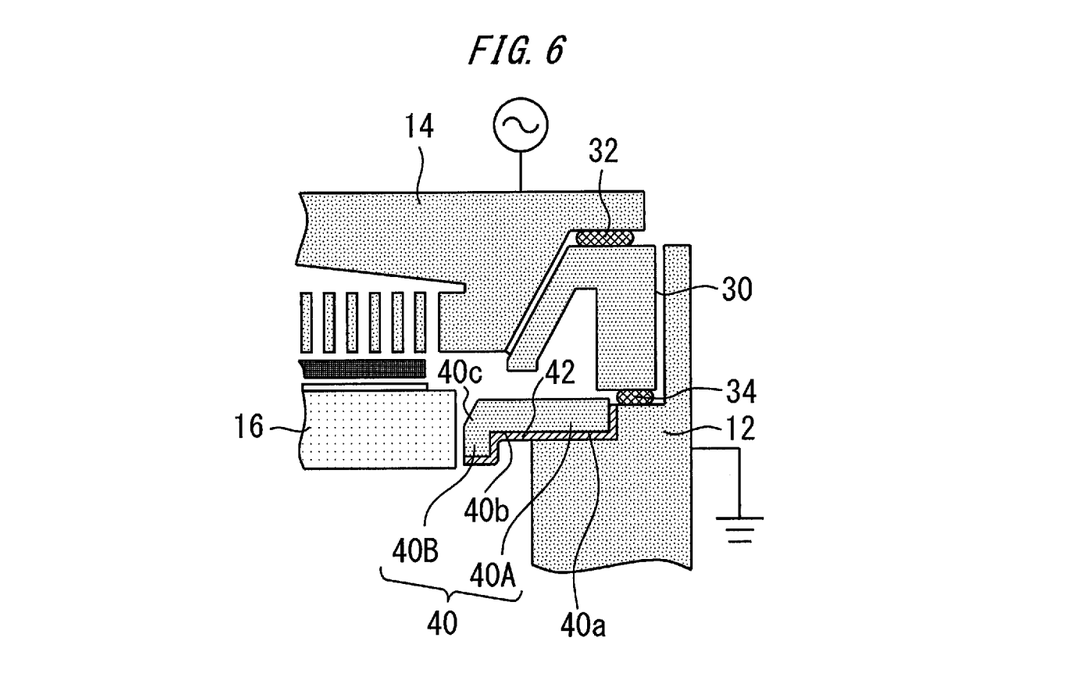
FIG. 6 shows another example of the second lower surface.

FIG. 6 shows a second lower surface 40b which connects to the first lower surface 40a as the lower surface of the support portion 40A and has the same height as the first lower surface 40a. The second lower surface 40b corresponds to the lower surface of the protrusion portion 40B. The metal film 42 is formed on the first lower surface 40a and the second lower surface 40b. In this case, the distance between the metal film 42 and plasma is larger than those in the cases of FIGS. 3 and 5.

Figure 7:
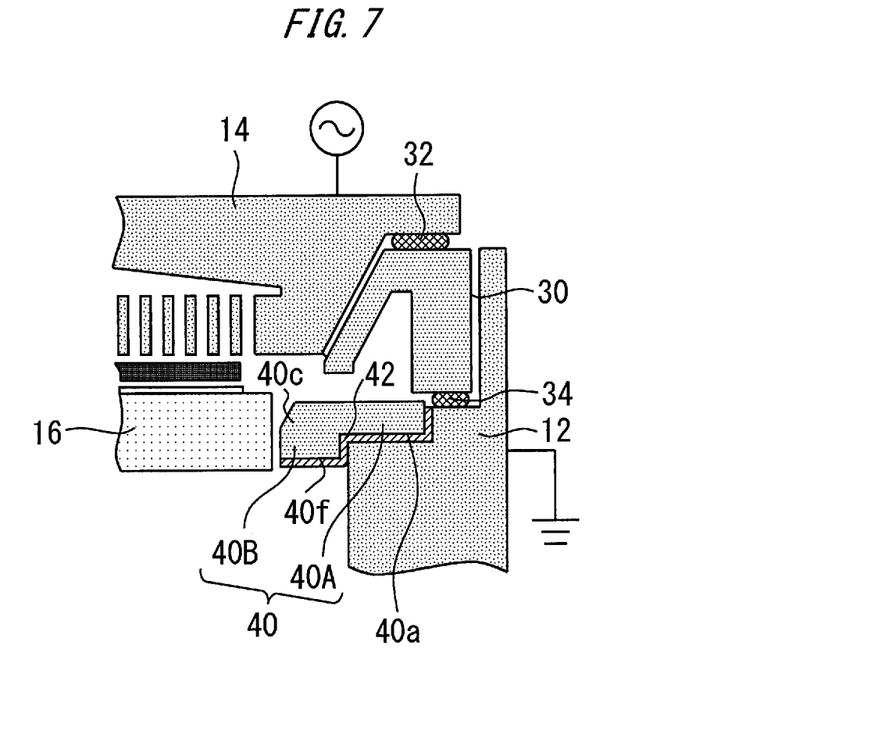
FIG. 7 shows another example of the second lower surface.

FIG. 7 shows a second lower surface 40f which connects to the first lower surface 40a as the lower surface of the support portion 40A and is lower than the first lower surface 40a. The second lower surface 40f is the lower surface of the protrusion portion 40B. Since the second lower surface 40f is located to be lower than the first lower surface 40a, the portion on the chamber 12 side of the protrusion portion 40B is set to be thicker than the support portion 40A. The metal film 42 is formed on the first lower surface 40a and the second lower surface 40b. In this case, the distance between the metal film 42 and plasma is larger than those in the cases of FIGS. 3, 5 and 6.

Figure 8:
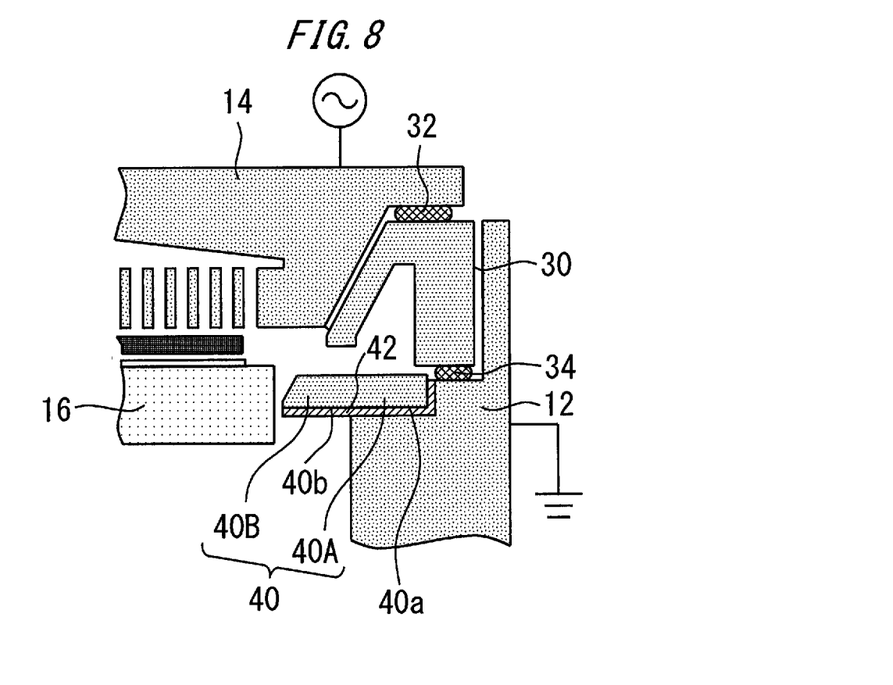
FIG. 8 shows FCR in which the support portion and the protrusion portion are coincident with each other in thickness.

FIG. 8 shows FCR 40 in which the support portion 40A and the protrusion portion 40B are coincident with each other in thickness. The lower surface of FCR 40 is a flat surface. The metal film 42 is formed on the lower surface of FCR 40. In this case, the foregoing effect can be achieved by FCR 40 having a simple shape.

Figure 9:
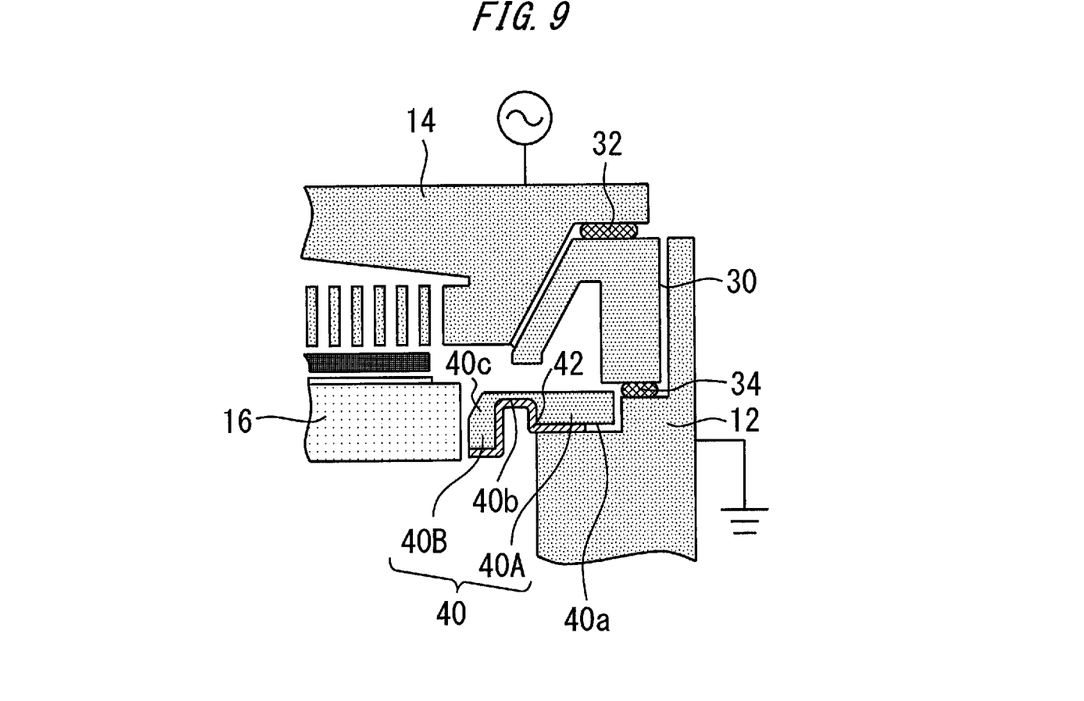
FIG. 9 shows that the metal film exposes a part of the first lower surface.

FIG. 9 shows that the metal film 42 exposes a part of the first lower surface 40a. The metal film 42 is required to be in contact with the chamber 12, but the contact area therebetween is not required to be large. The metal film 42 of FIG. 9 has a smaller area than the metal film 42 of FIG. 3, and this is suitable for reduction of the cost.

Figure 10:
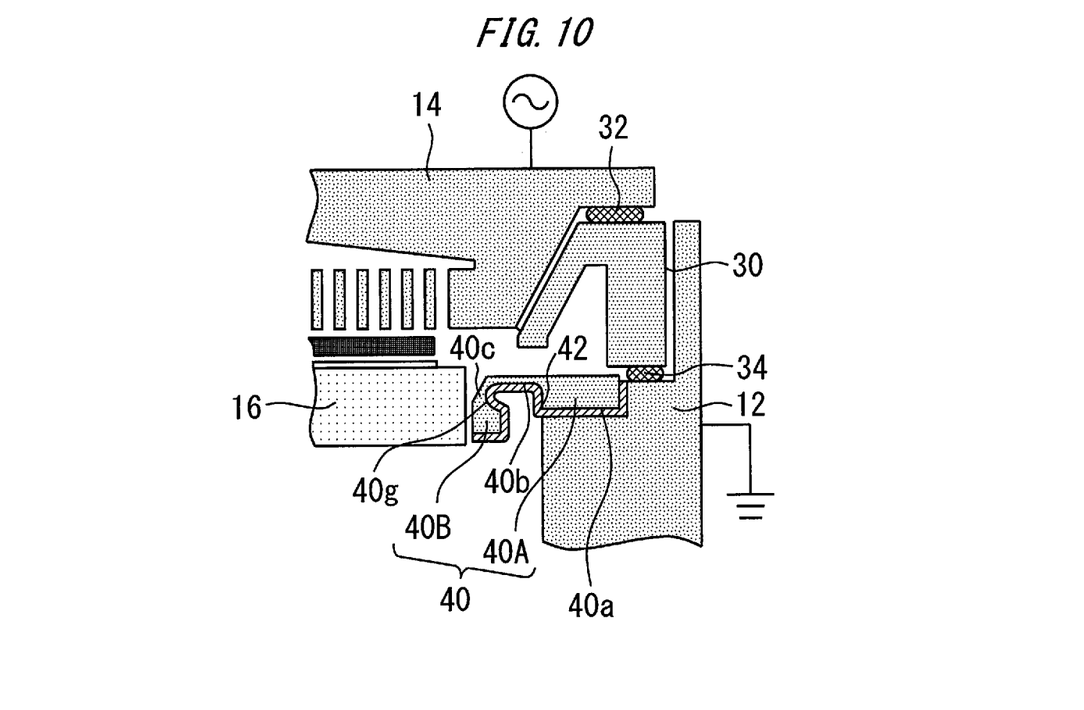
FIG. 10 shows a groove portion formed on the side surface of the thick wall part.

FIG. 10 shows a groove portion 40g formed on the side surface of the thick wall part 40c. The groove portion 40g is formed on the side surface on the chamber 12 side of the thick wall part 40c. The metal film 42 is provided in the groove portion 40g. In this case, the metal film 42 provided in the groove portion 40g is close to the plasma end portion, and relatively greatly influences the shape of plasma. As described above, the shape of the lower surface of the protrusion portion 40B is variously changed and the metal film 42 is formed on the lower surface of the protrusion portion 40B, whereby the distance between the metal film 42 and plasma can be set to a desired distance. The shapes of the lower surface of FCR 40 which are explanatorily shown in FIGS. 5 to 10 may be modified to different shapes to optimize the distance between the metal film 42 and plasma.

An ideal plasma distribution can be easily achieved when the width of the shower plate is equal to the width of the susceptor. However, when the width of the shower plate 14 is larger than the width of the susceptor 16 as shown in FIG. 1, it is difficult to control the plasma processing on the outer peripheral portion of a wafer. The metal film 42 formed on the lower surface of FCR 40 is provided just below the outer edge portion of the shower plate 14, whereby a portion having the substantially same potential as the susceptor 16 is expanded in the width direction. An electric potential of the susceptor 16 may be slightly different from an electric potential of the chamber 12. But these electric potentials may have substantially same electric potential when plasma generation. The susceptor 16 may be located just below the center of the shower plate 14 and the metal film 42 may be provided just below the outer edge portion of the shower plate 14.

Various modifications may be applied to the substrate processing apparatus 10 according to the some examples without losing the features of the substrate processing apparatus 10. For example, FCR 40 and the exhaust duct 30 provided above FCR 40 may be integrated with each other with the slit 33 being left. These modifications may be applied to a substrate processing apparatus according to the following examples. The substrate processing apparatus of the following examples has many common points to the already described examples, and thus different points from the already described examples will be mainly described below.

Figure 11:
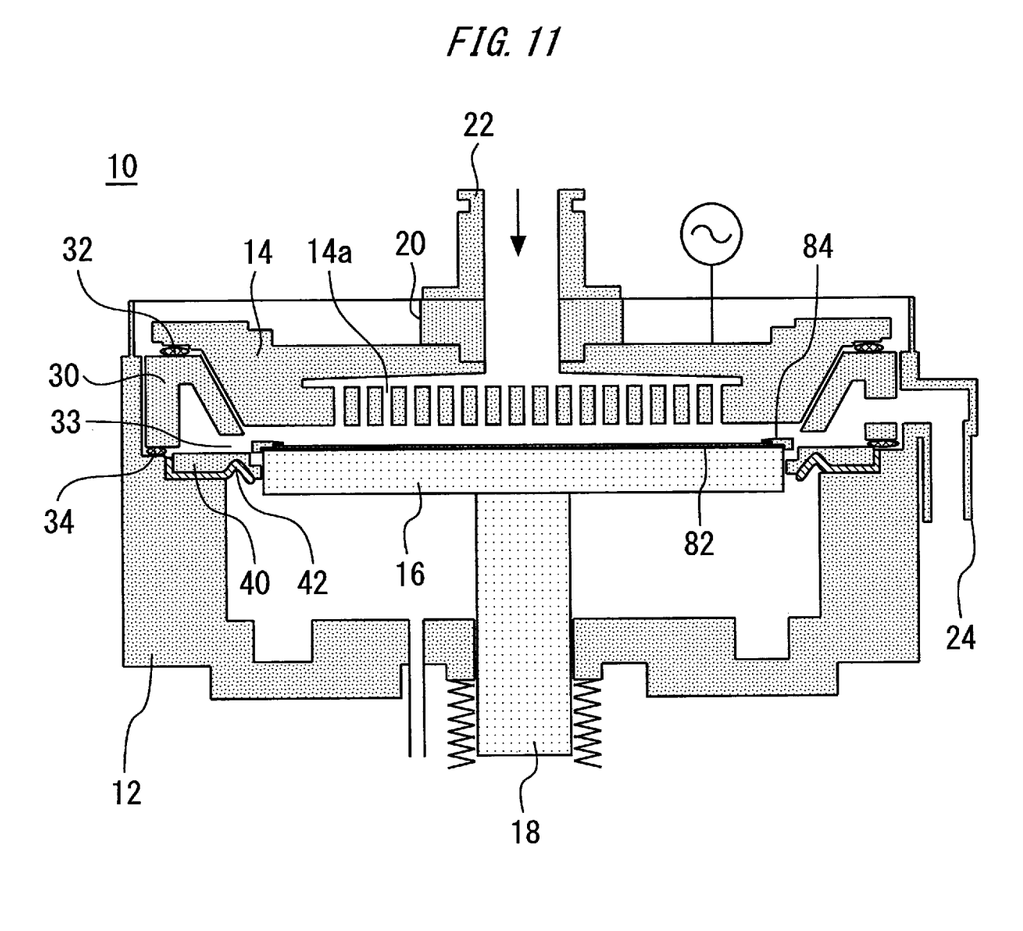
FIG. 11 is a cross-sectional view showing a substrate processing apparatus according to some examples.

FIG. 11 is a cross-sectional view showing a substrate processing apparatus according to some examples. The shower plate 14 and the susceptor 16 are opposed to each other. A wafer 82 is mounted on susceptor 16. A mask 84 covers the outer peripheral portions of the susceptor 16 and the wafer 82. The material of the mask 84 may be an insulator. For example, the mask 84 may be formed of ceramic material. In some examples, the mask 84 is arranged on the susceptor 16 with the wafer 82 interposed therebetween. The internal portion of the FCR 40 may have a step to support the mask 84 as the susceptor 16 moves downward.

Figure 12:
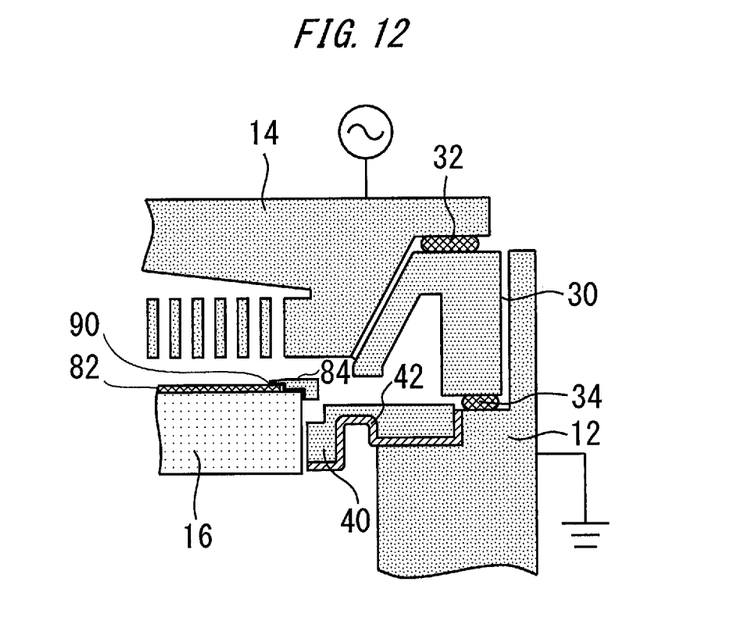
FIG. 12 is a partially enlarged view of FIG. 11.

FIG. 12 is a partially enlarged view of FIG. 11. A wafer 82 is mounted on the susceptor 16. A heater may be provided in or below the susceptor 16.

The shape of the mask 84 in plan view may be an annular shape, which enables the mask 84 to cover the outer peripheral portions of the susceptor 16 and the wafer 82. The mask 84 is supported by the susceptor 16. The mask 84 and the susceptor 16 may be brought into contact with each other.

Figure 13:
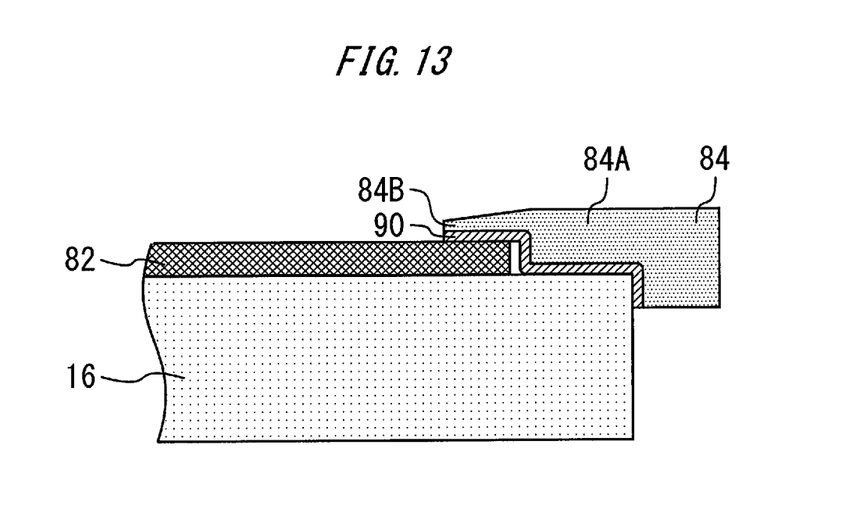
FIG. 13 is an enlarged view of the mask.

FIG. 13 is an enlarged view of the mask 84, etc. The mask 84 has a center portion 84B, and an outer portion 84A connected to the center portion 84B. The center portion 84B is a portion which is closer to the center of the susceptor 16 than the outer portion 84A. The center portion 84B may be configured in a tapered shape. A metal film 90 is formed on the lower surface of the mask 84. More specifically, the metal film 90 is formed on the whole lower surface of the mask 84, and the upper surface of the mask 84 is exposed. The metal film 90 is electrically connected to the chamber 12. For example, the metal film 90 can be electrically connected to the chamber 12 by connecting the metal film 90 to the chamber 12 via the susceptor 16.

This mask 84 is called a "bevel ring". The center portion 84B of the mask 84 covers the outer edge portion of the wafer 82, so that the distance between electrodes for generating plasma increases as the position shifts to the outside of the wafer. Therefore, the density of plasma can be prevented from decreasing at the outer peripheral portion of the wafer. In addition, according to this example, it is possible in some examples to adjust the plasma distribution by forming the metal film 90 having the same potential as the chamber 12 on the lower surface of the mask 84.

Figure 14:
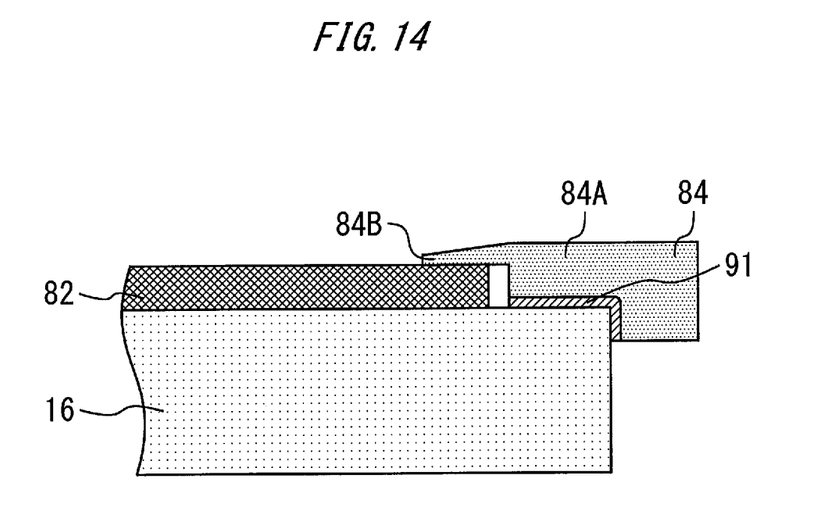
FIG. 14 shows a metal film according to another example.

FIG. 14 shows a metal film 91 according to another example. The metal film 91 covers the lower surface of the outer portion 84A while exposing the lower surface of the center portion 84B. In this case, the distance between plasma and the metal film 91 can be set to be larger as compared with the case of FIG. 13.

Figure 15:
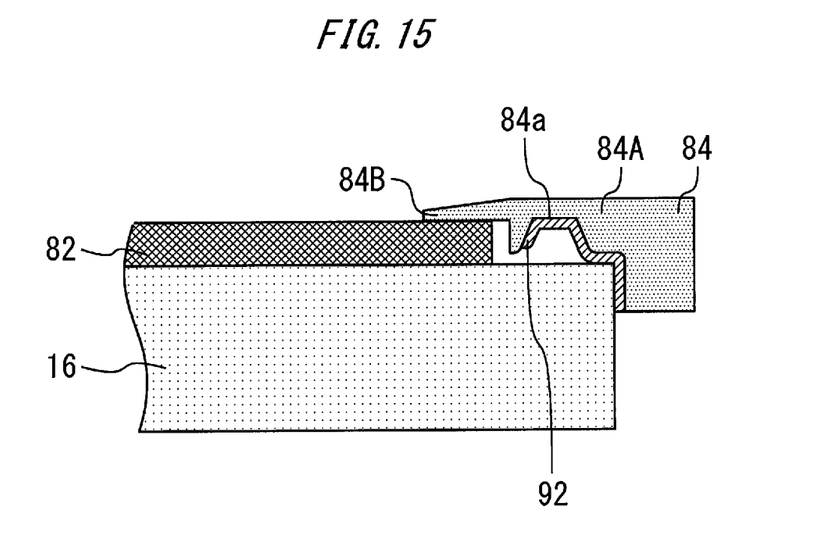
FIG. 15 shows a metal film according to another example.

FIG. 15 shows a metal film 92 according to another example. A groove portion 84a is formed on the lower surface of the outer portion 84A of the mask 84. The metal film 92 is formed in the groove portion 84a. By forming the metal film 92 in the groove portion 84a, a plasma distribution different from those of FIGS. 13 and 14 can be achieved.

Figure 16:
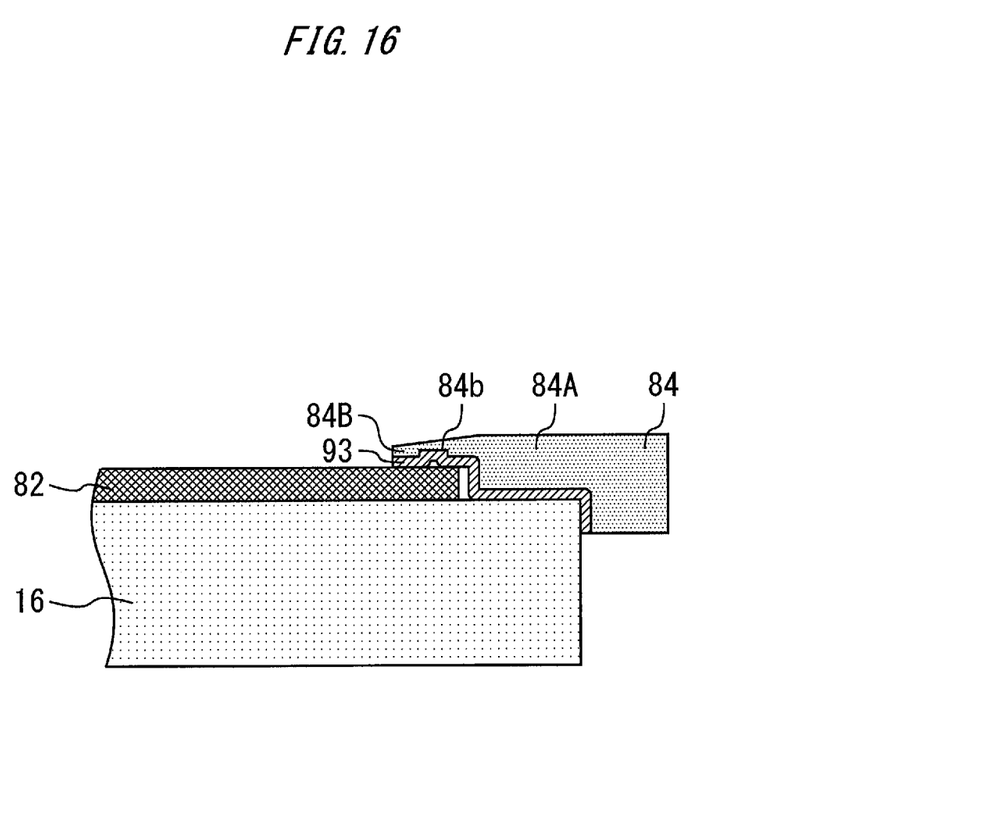
FIG. 16 shows a metal film according to another example.

FIG. 16 shows a metal film 93 according to another example. A groove portion 84b is formed on the lower surface of the center portion 84B of the mask 84. The metal film 93 is formed in the groove portion 84b. By forming the metal film 93 in the groove portion 84b, a plasma distribution different from those of FIGS. 13 to 15 can be achieved. In order to adjust the distance between plasma and the metal film, the shape of the lower surface of the mask may be made different from those of FIGS. 13 to 16.

What is claimed is:

1. A substrate processing apparatus comprising:
   a chamber;
   a susceptor provided in the chamber;
   a flow control ring of an insulator that is mounted on an inner side wall of the chamber and surrounds the susceptor, substantially all of an upper surface of the flow control ring is exposed;
   a shower plate opposed to the susceptor; and
   a metal film that is continuously formed on a lower surface of the flow control ring while exposing the upper surface of the flow control ring, and is in contact with the chamber, the metal film disposed between the lower surface of the flow control ring and the chamber, and further extending radially inward past the inner side wall of the chamber into a space formed between the inner side wall of the chamber and the susceptor.

2. The substrate processing apparatus according to claim 1, wherein the shower plate has a larger width than the susceptor.

3. The substrate processing apparatus according to claim 1, wherein the flow control ring includes a support portion supported by the chamber just above the chamber, and a protrusion portion that connects to the support portion and protrudes into the chamber, the support portion has a first lower surface, a lower surface of the protrusion portion has a second lower surface higher than the first lower surface, and the metal film is formed on the first lower surface and the second lower surface.

4. The substrate processing apparatus according to claim 3, wherein the flow control ring has a thick wall part having the largest thickness at a portion opposed to the susceptor.

5. The substrate processing apparatus according to claim 4, wherein a groove portion is formed on a side surface of the thick wall part, and the metal film is provided in the groove portion.

6. The substrate processing apparatus according to claim 3, wherein the metal film exposes a part of the first lower surface.

7. The substrate processing apparatus according to claim 1, wherein the flow control ring includes a support portion supported by the chamber just above the chamber, and a protrusion portion that connects to the support portion and protrudes into the chamber, the support portion has a first lower surface, and a lower surface of the protrusion portion has a second lower surface flush with the first lower surface, and the metal film is formed on the first lower surface and the second lower surface.

8. The substrate processing apparatus according to claim 1, wherein the flow control ring includes a support portion supported by the chamber just above the chamber, and a protrusion portion that connects to the support portion and protrudes into the chamber, the support portion has a first lower surface, and a lower surface of the protrusion portion has a second lower surface lower than the first lower surface, and the metal film is formed on the first lower surface and the second lower surface.

9. The substrate processing apparatus according to claim 1, further comprising a gas supplier for supplying gas into a space between the chamber and a lower surface of the susceptor.

* * * * *